(12) United States Patent
Smith

(10) Patent No.: US 6,596,391 B2
(45) Date of Patent: *Jul. 22, 2003

(54) VERY ULTRA THIN CONDUCTOR LAYERS FOR PRINTED WIRING BOARDS

(75) Inventor: Gordon C. Smith, Arlington Hts., IL (US)

(73) Assignee: Honeywell International Inc., Morristown, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/075,732

(22) Filed: May 11, 1998

(65) Prior Publication Data

US 2001/0055676 A1 Dec. 27, 2001

Related U.S. Application Data

(60) Provisional application No. 60/047,019, filed on May 14, 1997.

(51) Int. Cl.[7] .................... B32B 15/04; B32B 7/12; B32B 15/08; B32B 27/30
(52) U.S. Cl. ................ 428/344; 428/352; 428/457; 428/461; 428/626; 428/901
(58) Field of Search .................. 428/457, 458, 428/460, 461, 469, 901, 914, 624, 626, 343, 344, 352, 209

(56) References Cited

U.S. PATENT DOCUMENTS

| 3,884,693 A | * | 5/1975 | Bauer et al. ............... 96/15 |
| 3,984,598 A | * | 10/1976 | Sarazin et al. ............ 428/336 |
| 4,250,209 A | * | 2/1981 | De Leeuw et al. ......... 427/250 |
| 4,383,003 A | | 5/1983 | Lifshin et al. ............. 428/611 |
| 4,431,710 A | | 2/1984 | Lifshin et al. ............. 428/650 |
| 4,357,395 A | | 11/1985 | Lifshin et al. ............. 428/607 |
| 4,621,019 A | * | 11/1986 | Vikesland ................. 428/347 |
| 4,908,940 A | * | 3/1990 | Amano et al. .............. 29/852 |
| 5,156,720 A | | 10/1992 | Rosenfeld et al. ........... 205/76 |
| 5,258,236 A | * | 11/1993 | Arjavalingam et al. ..... 428/626 |
| 5,262,247 A | | 11/1993 | Kajiwara et al. ........... 428/607 |
| 5,362,534 A | | 11/1994 | McKenney et al. .......... 428/40 |
| 5,557,843 A | | 9/1996 | McKenney et al. .......... 29/851 |
| 5,637,176 A | * | 6/1997 | Gilleo et al. ............... 156/277 |
| 5,667,851 A | * | 9/1997 | Edman et al. .............. 205/95 |

OTHER PUBLICATIONS

Tessier, T.G. and Garrou, P.E., "Overview of MCM Technologies: MCM–D", *ISHM '92 Proceedings* pp. 235–247 (1992).

* cited by examiner

*Primary Examiner*—Holly Rickman
(74) *Attorney, Agent, or Firm*—Riordan & McKinzie; Sandra P. Thompson

(57) ABSTRACT

Disclosed is a metal-clad laminate product having a carrier film, a aqueous soluble release or parting layer deposited onto the carrier film and which can be mechanically separated from the carrier film, and an ultra thin metal layer deposited onto the parting layer. Also disclosed is a method for making the metal-clad laminate product.

12 Claims, 1 Drawing Sheet

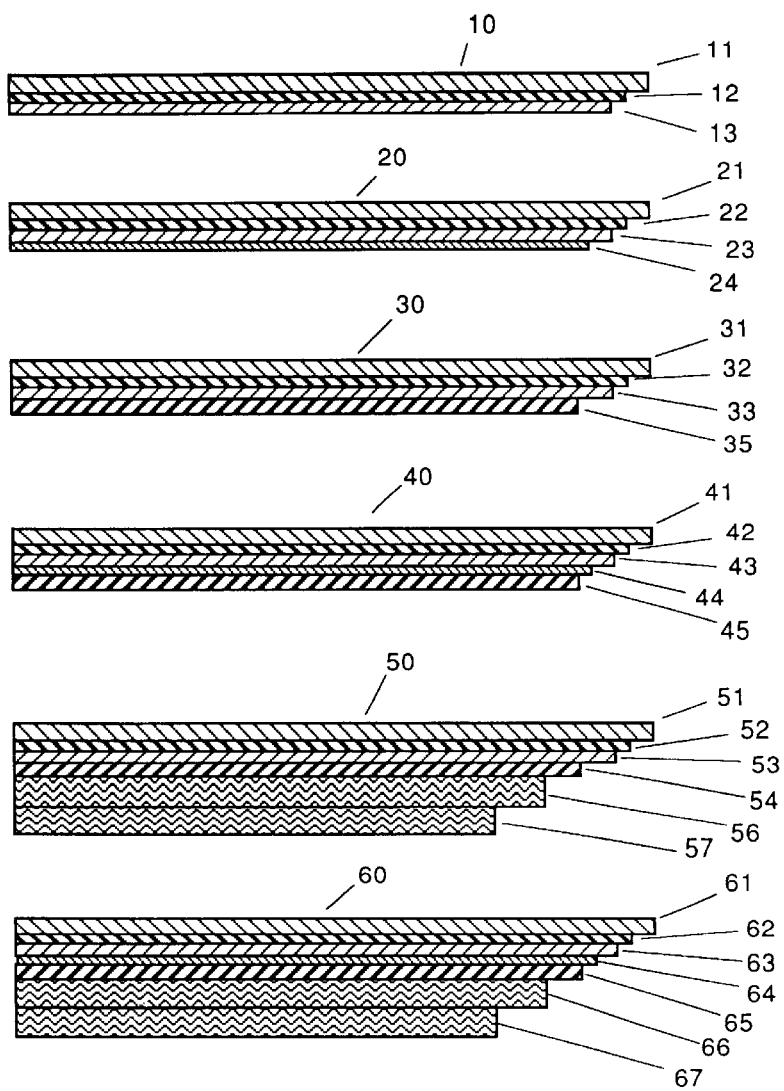

VERY ULTRA THIN CONDUCTOR LAYERS FOR PRINTED WIRING BOARDS

CROSS-REFERENCE TO RELATED APPLICATIONS

This application claims priority from provisional application Ser. No. 60/047,019, filed May 14, 1997.

STATEMENT REGARDING FEDERALLY SPONSORED RESEARCH OR DEVELOPMENT

Not applicable

BACKGROUND OF THE INVENTION

The electronics industry continues to seek enhanced performance from products such as printed wiring boards used with integrated circuits in order to meet consumer demand for higher performance, lower cost computers and electronics equipment. Driving forces within the electronics industry include a desire for increased speed and functionality which requires reduced size of both components and interconnectors. Among the means by which interconnection circuitry can be reduced in size include the design of circuit boards that have smaller, finer lines and spaces to increase the line density on boards. Increasing line density leads to fewer circuit layers and smaller, lighter, electronic devices.

Printed wiring board circuitry can reside on a rigid fiberglass reinforced plastic or on flexible films to which are adhered metal foils used to form conductive circuit connections. The boards can contain interconnecting circuitry on one layer, two layers, or multiple layers. Boards with three or more layers can be manufactured using multiple two layer boards laminated together forming a multi-layer construction, or can be built up from a two layer board by sequentially adding dielectric layers and circuits.

Multilayer boards are most typically manufactured by laminating circuitized double sided boards in a stack using sheets of thermosetting polymers impregnated in fiberglass, known as pre-preg. Typically the outer most circuitized layers are added by using a sheet of pre-preg and a sheet of metal foil. The circuit connections on the double sided core circuits are usually manufactured by using subtractive techniques, while the outer metal conductor layer is shaped in a semi-additive method. The multiple circuit layers are electrically connected by mechanical drilling of holes through the board and plating with a conductive metal.

Sequential built-up boards are manufactured by laminating foils coated with thermosetting resins to a circuitized double sided board. The coated resin layer serves as a controlled dielectric layer separating the built-up circuit layer from the double sided circuit board. Electrical connections between circuit layers are made by plasma or laser drilling, followed by plating the resulting connecting hole. Circuitizing the built-up circuit is accomplished using semi-additive methods. Build-up layers can be stacked forming a circuit with many layers.

Circuit board designers require substrate materials on which extremely fine lines and spaces can be formed with a high degree of precision. Thin metal foils are generally a preferred substrate for the formation of circuit lines on circuit boards. The use of thicker foils results in greater waste of metal and reduces the line density that can be achieved. The metal films are most commonly formed by electrodeposition. Electrodeposited copper films typically must be of a defined minimum thickness, >1 $\mu$m, to avoid holes or discontinuities.

Metal foils that are currently in use in the industry are typically at least 5 $\mu$ms in thickness. The use of thinner metal foil in printed circuit board would allow the formation of more densely packed lines and would reduce production costs. There is a significant interest in developing methods for obtaining thin copper foils. Existing methods for obtaining and placing a very thin metal foil on a laminate are limited.

U.S. Pat. No. 4,357,395 discloses a copper-clad laminate that is made by first forming a layer of silica on an aluminum carrier and then sputtering a copper film onto the silica layer. The copper layer is then laminated to a substrate, and the carrier and silica layer are mechanically stripped away, leaving the copper layer exposed. The examples disclosed that copper films 5–10 $\mu$ms in thickness were obtained by this method.

The method disclosed in U.S. Pat. No. 4,357,395 is not suitable for the manufacture of copper-clad laminates having an very ultra thin (0.1–0.3 $\mu$m) copper foil, because very ultra thin foils are susceptible to picking when the carrier and silica layers are mechanically removed.

U.S. Pat. No. 4,431,710 reveals an aluminum carried copper foil where the copper was deposited onto the aluminum foil using vapor deposition at temperatures between about 100° C. and 250° C. Copper film of 5 $\mu$ms in thickness was demonstrated. After lamination to a substrate, the aluminum carrier is removed with a peel force of 0.5 lbs./in. to 2.0 lbs./in. The disclosure discusses the variability in the peel strength experiences by this method. The high peel strengths and variability would be detrimental to very ultra thin foils of less than 1 $\mu$m in thickness. In addition, the exemplified foil is shown to have a significant impact on peel strength, dependent on contaminants.

U.S. Pat. No. 5,262,247 describes a foil consisting of a copper carrier layer, a chromate parting layer, a copper-nickel alloy layer, and finally a thin copper foil layer. Upon lamination the copper carrier plus chromate layer is removed. The resulting metallized substrate requires etching of the copper-nickel layer to reveal the copper layer. It is emphasized and claimed that the thin copper foil layer must be 1 $\mu$m to 10 $\mu$ms in thickness. Below 1 $\mu$m copper thickness is not used due to the etching step required to remove the copper-nickel layer. Etching the copper-nickel layer will also etch the underlying copper layer.

What is needed in the art is a method for obtaining very ultra thin metal foil laminates for the manufacture of printed circuit boards.

BRIEF SUMMARY OF THE INVENTION

It is the object of the present invention to provide a metal-clad laminate for use in the manufacture of printed circuit boards, the laminate having a very ultra thin metal foil that will support the formation of very fine lines and spaces thereon.

Another object of the present invention is to provide a method for large scale production of a metal-clad laminate for the manufacture of printed circuit boards, the laminate having a very ultra thin metal foil that will support the formation of very fine lines and spaces.

It is a further objective of the invention to supply a foil for use in multi-layer and built-up circuit boards, the foil being very ultra thin to enable fine line circuit formation.

The present invention is a metal-clad laminate for the manufacture of printed circuit boards, the laminate having a very ultra thin metal foil that is at most about one $\mu$m in thickness.

The present invention is also a method of manufacturing a metal-clad laminate for the manufacture of printed circuit boards, the laminate having a very ultra thin metal foil that is at most about one µm in thickness.

BRIEF DESCRIPTION OF THE SEVERAL VIEWS OF THE DRAWINGS

FIG. 1 is a cross-sectional illustration of a metal-clad laminate intermediate constructed in accordance with the present invention.

FIG. 2 is a cross-sectional illustration of an alternative metal-clad laminate constructed in accordance with the present invention.

FIGS. 3–6 illustrate cross-sectional views of alternative embodiments of the invention.

DETAILED DESCRIPTION OF THE INVENTION

The present invention is directed toward very ultra thin metal conductive layers which are formed by vapor deposition or sputtering of the conductive metal on a polymeric or metal carrier film which has been coated with an organic polymeric release agent. The term "release agent layer" and "parting layer" are used interchangeably and refer to the same layer of material. The metal conductive layer can then be bonded to a printed wiring board substrate, such as an epoxy based laminate. Then the carrier film can be separated from the polymeric release agent, leaving the metal conductive layer bonded to the substrate. Using this approach, conductive metal layers in the range of 0.005 µm to 1.0 µm (50 to 10,000 Angstroms) become practical.

In accordance with the present invention, a metal-clad laminate product for use in the manufacture of printed circuit boards can be made including a polymer or metal foil carrier layer, a polymeric parting layer formed on the carrier film, a very ultra thin metal layer formed on the release agent layer. Shown in FIG. 1 is a metal-clad intermediate 10 made in accordance with the present invention. The intermediate 10 is made up of a carrier film 11 to which is applied a polymeric release agent layer 12, onto which is applied a very ultra thin conductive metal layer 13.

Shown in FIG. 2 is an alternative embodiment of such a metal clad laminate product here designated 20. In the embodiment of FIG. 2, a carrier film 21 is applied to polymeric release agent layer or parting layer, 22. Onto the release agent layer 22 is deposited a primary very ultra thin conductive metal layer 23. On top of the primary metal layer 23 is a secondary metal layer 24, also preferably formed by sputtering or vapor deposition.

Shown in FIG. 3 is an alternative embodiment metal clad intermediate 30 is illustrated which includes a carrier film 31, a release agent or parting layer 32, and a primary very ultra thin conductive metal layer 33. Also deposited on the metal layer 33 is an adhesion layer 35.

Shown in FIG. 4 is another embodiment which includes in a metal clad intermediate 40, a carrier film 41, a release agent layer 42, a very ultra thin primary metal layer 43, a secondary metal layer 44 and an adhesive layer 45.

In FIG. 5 an alternative metal clad intermediate 50 is shown which includes a carrier film 51, a release agent layer 52, a very ultra thin primary metal layer 52, and an adhesion layer 54. This embodiment also includes two layers of circuit board resin laminate material, designated here 56 and 57.

Shown in FIG. 6 is another alternative metal clad intermediate 60 including a carrier film 61, a release agent layer 62, a primary metal layer 63, a secondary metal layer 64, an adhesion layer 65, and two layers of resin laminate materials 66 and 67.

These alternative embodiments are illustrated and discussed to exemplify the wide variation in selection and number of layers that can be used to assemble such intermediates.

Preferably, the carrier film comprises a flexible, dimensionally stable material with good tear and chemical resistances. The carrier film should be able to tolerate above-ambient temperatures. Preferably, the carrier film is made of a material having low absorbed moisture and residual solvent, because water and solvents can interfere with the metallization step. Suitable materials include polymeric film or metal foils. A metal foil is preferred because metal foils tend to have high tensile strength at elevated temperatures, low absorbed moisture, and low residual solvent.

The carrier film employed in the examples below was an electroplated copper foil or a polyimide film. Other metal foils that would make suitable carrier films include rolled or electrodeposited metal and metal alloys including steel, aluminum (Alcoa, AllFoils), and copper (Gould Inc., Oak Mitsui Inc.). It is expected that certain polymeric films would be suitable for the practice of the present invention. Examples of suitable polymeric films include polyesters such as polyethylene terephthalate, poly-butylene terephthalate and polyethylene naphthalate (Kaladex®, ICI America), polypropylene, polyvinyl fluoride (Tedlar®, DuPont), polyimide (Kapton®, DuPont; Upilex®, UBE Industries), and nylon (Capran®, AlliedSignal).

The release agent layer (11 in FIG. 1, 21 in FIG. 2, 31 in FIG. 3, etc.) is used to facilitate removal of the carrier film from the very ultra thin metal layer. In order to avoid the problem of picking, which results in incomplete transfer of the very ultra thin metal foil to the substrate under lamination, the release agent layer is designed to peel at the interface between the parting layer and film carrier. The parting layer is subsequently removed with the aid of a plasma, an oxidating environment, intense light, or an appropriate solvent. Preferably, the layer is removed by washing with a solvent, most preferably an aqueous solution. In methods that lack a release agent layer, and in methods that employ a release agent layer that peels at the interface between the parting layer and the very ultra thin metal layer, incomplete transfer of the metal of the very ultra thin metal foil to the substrate commonly occurs.

The parting layer (12 in FIG. 1, 22 in FIG. 2, etc.) is made of a polymeric material. Preferably, the parting layer is an aqueous-soluble material to facilitate its convenience removal from the very ultra thin metal layer. Because photo resists are developed in an alkaline environment, it would be most preferable to use a parting layer that is soluble in an alkaline aqueous solution. A useful polymer is one that is of a good film-forming material. The polymer can be coated from water with the aid of a volatile base such as ammonium hydroxide to aid solubility. Optionally, the parting layer comprises a water-soluble surfactant to improve solution wetting properties, and to control drying defects.

As detailed in the examples below, one useful release agent, or parting layer, is applied as a formulation comprising a polyvinylpyrrolidone (PVP) polymer, a surfactant, and water. The wet weight composition of the parting layer formulation described in the examples is 10% PVP and 0.5% surfactant. It is expected that formulations containing PVP in the range of from about 1% PVP to about 50% PVP, and surfactant in the range of from about 0% surfactant to about 5% surfactant would also be suitable for the practice of the present invention. Preferred PVPs for use in the present invention have a molecular weight in the range of about 10,000 to about 5,000,000. It is reasonable to expect that a release agent layer comprising a polymer such as acid modified acrylic polymers, acrylic copolymers, urethanes, and polyesters, carboxylic acid functional styrene acrylic resins (S. C. Johnson Wax, Joncryl®), polyvinyl alcohols (Air Products & Chemicals, Airvol®), and cellulose based polymers could be successfully employed in the practice of the present invention. Other suitable water soluble surfactants that could be used in the parting layer of the present invention include alkylarylpolyether alcohols (Rohm & Haas, Triton® X100), glycerin, ethoxylated castor oil (CasChem Inc., Surfactol® 365), and fluoroaliphatic polymeric esters (3M Corporation, Fluorad® 430). The release agent layer formulation is applied in an amount sufficient to achieve a dry weight of from about 10 mg/ft$^2$ to about 1000 mg/ft$^2$, about 0.1 $\mu$m to 10 $\mu$m in thickness. Preferably, the release agent layer formulation is applied in an amount sufficient to achieve a dry weight of from about 100 mg/ft$^2$ to about 400 mg/ft$^2$, about 1 $\mu$m to 4 $\mu$m in thickness.

As described in detail in the examples, a thin primary conductive metal layer (13 in FIG. 1, 23 in FIG. 2, etc.) can be deposited onto the parting layer by sputtering using a Desk III sputtering unit. It is expected that any sputtering or vapor deposition method known in the art may be successfully used in this invention. The primary metal layer is used as a plating seed layer for subsequent circuit formation. In the examples below, the metal layer was made from gold, chrome, or copper. Other suitable metals include, but not limited to, tin, nickel, aluminum, titanium, zinc, chromium-zinc alloy, brass, bronze, and alloys of the same. The metal layer may be made from a mixture of suitable metals. The primary layer is from about 0.005 $\mu$m (50 Angstroms) to about 1.0 $\mu$m (10,000 Angstroms) in thickness. Most preferably the primary layer has thickness of from about 0.1 $\mu$m to about 0.3 $\mu$m (1000 to about 3000 Angstroms).

Optionally, a secondary metal layer (such as layer 24 in FIG. 2, 44 in FIG. 4, or 64 in FIG. 6) may be employed to protect the primary layer from oxidation, to increase adhesion during lamination, or to act as a barrier to metal migration. The secondary layer may be from about 0.001 $\mu$m (10 Angstroms) to about 0.1 $\mu$m (1000 Angstroms) in thickness. Most preferably the secondary layer has thickness of from about 0.01 $\mu$m (100 Angstroms) to about 0.03 $\mu$m (300 Angstroms). To form the secondary metal layer, a layer of zinc, indium, tin, cobalt, aluminum, chrome, nickel, nickel-chrome, brass, or bronze is deposited on the first metal layer. Other suitable metals include magnesium, titanium, manganese, bismuth, molybdenum, silver, gold, tungsten, zirconium, antimony, and chromium-zinc alloys. The secondary metal layer prevents the metal in the first metal layer from oxidizing after removal from the metallizing chamber, and increases adhesion to thermosetting resin systems.

Optionally, an adhesion layer (e.g. 35 in FIG. 3, 45 in FIG. 4, etc.) can be applied to the metal layer. The adhesion layer may be employed in order to increase the bond between the metal layers and the substrate layers following lamination. The adhesion layer may be organic, organometallic, or inorganic compounds, and applied to a thickness of 0.0005 $\mu$m (5 Angstroms) to 10 $\mu$m (100,000 Angstroms). Multiple layers may be used such as an organometallic layer followed by an organic layer. Typically when an organometallic layer is used, such as a silane, the coating will be from 0.0005 $\mu$m (5 Angstroms) to 0.005 $\mu$m (500 Angstroms) in thickness.

When using organic adhesion layers, such as thermoplastics, thermosetting polymers, or mixtures, the coating would be 0.1 $\mu$m (1000 Angstroms) to 10 $\mu$m (100,000 Angstroms) in thickness.

Useful organometallic compounds include materials based on zirconium, titanium, and silicon. Silicon based organometallics, known as silanes or coupling agents, are widely used and available. The coupling agent may be applied neat or applied after dissolving it in an appropriate solvent. Suitable coupling agents typically have a silane-hydrolyzable end group with alkoxy, acyloxy, or amine functionality, and an organofunctional end group. The hydrolyzable end group reacts with the metal surface while the organofunctional group bonds to the substrate layer to which the metal is laminated. Coupling agents can be subjected to a hydrolysis reaction prior to coating if dissolved in an acidic medium. Useful coupling agents include compounds such as N-(2-aminoethyl)-3-aminopropyltrimethoxy silane (Dow Corning, Huls America Inc.) and 3-Glycidoxypropyltrimethoxy silane (Dow Corning, Huls America Inc.). Organic adhesion layers consisting of thermoplastics, thermosetting polymers, or mixtures are appropriate adhesion layers. These adhesives can be based on polyimide resins, epoxy resins, polyester resins, acrylic resins, butadiene rubbers, and the like. One useful adhesive consisting of a polyester epoxy system is available (Cortaulds, Z-Flex™).

Resin layers can be applied to the metal layer or to the adhesion layer (if present) in uses where a controlled dielectric thickness is required. Such uses include built up technologies. Typically the resins are thermosetting systems that are coated from an appropriate solvent. After drying, the resins can be cured to a semi-cured state if additional cure is required before lamination to a circuit board. A single semi-cured resin layer can be used. Preferably, two resin layers are used where the first resin layer down (primary layer) is cured to a greater extent than the second resin layer. The first resin layer serves as a controlled dielectric spacing layer and has a thickness of from about 5 to about 500 $\mu$ms, preferably from about 20 to about 50 $\mu$ms. Appropriate resin systems include (but not limited to): epoxy resins cured by phenolic or dicyandiamide hardeners, cyanate esters, bismaleimides, and polyimide systems. The second layer can have a different composition than the primary layer; however, to attain good interlayer adhesion, it is preferable that the composition of the second layer is similar to that of the first resin layer. The second resin layer serves as an adhesion layer and as a void filling layer during lamination and has a thickness between 5 and 500 $\mu$ms, preferably between 20 and 50 $\mu$ms.

By "laminating under suitable lamination conditions" it is meant laminating under appropriate conditions of temperature and pressure for a suitable period of time to adhere the layers together for practical use in making a circuit board laminate.

The following nonlimiting examples are intended to be purely illustrative.

EXAMPLE 1

Upilex® 50 $\mu$m polyimide film was obtained from the Ube Industries for use as the carrier film. 0.15 $\mu$m (1500 Angstroms) of copper was sputtered coated, followed by 0.01 $\mu$m (100 Angstroms) of a nickel-chrome alloy. The sample was pressed to make a circuit board laminate. Four layers of an FR-4 pre-preg known as FR406(AlliedSignal) was placed on a glass reinforced Teflon® sheet. Under the sheet was a stainless steel press plate. The above construction was placed metal side down on the Fr406 pre-preg. A second layer of glass reinforced Teflon® sheet was placed on the top and covered with a second stainless steel press plate. The stack was placed in a pre-heated press at 350° F. and pressed for 1.2 hours at 50 psi. The film was attempted to be peeled, but was difficult. Peel strength measured at an angle of 180° and found to vary between 1–5 lbs./in. Sections of the metal coating approximately 100 µm in size did not transfer and were left on the film. The metal coating "picked". The above was attempted a second time, and was found the metal coating would not peel from the film carrier. Metal adhesion to the film was high enough to cause the film to tear during a peel attempt.

EXAMPLE 2

A sample of 1 oz. electroplated copper foil was obtained from Gould Inc. for use as a carrier film. A release agent layer was formed by coating parting layer formulation P1 (Table 1) onto the copper carrier layer using a No. 18 wire-wound rod. Following application to the carrier film, the release agent layer was dried at 160° C. for about 2 minutes. The coating was clear. A gold metal conductive layer was sputtered onto the clear parting layer using a Desk III sputtering unit with air as the processing gas. Gold was deposited for 3 minutes. Examination an edge of the gold coating by microscopy revealed that a gold layer of approximately 0.3 µm (3000 Angstroms) in thickness was deposited.

The sample was pressed to make a circuit board laminate. Four layers of an FR-4 epoxy based pre-preg known as FR406 (AlliedSignal) was placed on a glass reinforced Teflon® sheet. Under the sheet was a stainless steel press plate. The above construction was placed metal side down on the FR406 pre-preg. A second layer of glass reinforced Teflon® sheet was placed on the top and covered with a second stainless steel press plate. The stack was placed in a pre-heated press at about 350° F. and pressed for about 1.2 hours at 50 psi. After cooling to room temperature, the copper carrier film peeled easily revealing the parting layer transferred completely with the metal coating. Washing the surface in warm water removed the release agent layer and revealed a shiny metal surface.

TABLE 1

Composition of parting layer formulation P1.

| Component | Source | Amount |
| --- | --- | --- |
| Polyvinylpyrrolidone, PVP-K90 | ISP Technologies | 5.00 g |
| Surfactol 365 | CasChem | 0.025 g |
| Water | | 44.975 g |

EXAMPLE 3

A sample of 1 oz. electroplated copper foil was obtained from Gould Inc for use as the carrier film. A release agent layer was formed by coating formulation P1 (Table 1) onto the copper carrier film using a No. 18 wire-wound rod. Following application to the carrier film, the parting layer was dried at 160° C. for about 2 minutes. The coating was clear. A gold metal layer was sputtered onto the clear parting layer using a Desk III sputtering unit with air as the processing gas. Gold was deposited for 3 minutes. Examination an edge of the gold coating by visible microscopy revealed that a gold layer of approximately 0.3 µm (3000 Angstroms) in thickness was deposited. A first resin layer was made by coating formulation R1 (Table 2) onto the gold layer using a No. 18 wire-wound rod. The first resin later was dried at about 50° C. for about 1 hour, then held at about 65° C. for about 1 hour, and finally cured at about 170° C. for about 6 minutes. A second resin layer was made by coating formulation R1 onto the first layer using a No. 18 wire-wound rod. The second resin was dried using the same drying conditions that were employed in for the first resin layer.

Four layers of an FR-4 pre-preg known as FR406 (AlliedSignal) were placed on a glass-reinforced Teflon® sheet. Under the sheet was a stainless steel press plate. A second layer of glass-reinforced Teflon® sheet was placed on the top and covered with a second stainless steel press plate. The stack was placed in a pre-heated press at 350° F. and pressed for 1.2 hours at 50 psi. After cooling to room temperature, the stack was broken down and the glass reinforced Teflon® sheet removed revealing and unclad laminate. The above construction was placed on top of the unclad laminate with resin side contacting the laminate. A glass reinforced Teflon® sheet covered the construction followed by a stainless steel press plate. A second stainless steel press plate was placed under the laminate. The stack was placed in a pre-heated press at 350° F. and pressed for 1.2 hours at 50 psi. After cooling to room temperature, the copper carrier film was peeled easily revealing the parting layer transferred completely with the metal coating and resin layers. Washing the surface in warm water removed the parting layer and revealed a shiny metal surface.

TABLE 2

Composition of resin formulation R1.

| Component | Source | Amount |
| --- | --- | --- |
| Epon 1031A70 | Shell Chemical | 1.98 g |
| DER732 | Dow Chemical | 5.67 g |
| PKHS-40 | Phenoxy Associates | 18.16 |
| Ciba 1138A85 | Ciba Geigy | 15.91 g |
| Quatrex 6410 | Dow Chemical | 22.69 |
| BT2110 | Mitsubishi Gas & Chemical | 34.97 g |
| DMF | | 7.37 g |
| Methyl Ethyl Ketone | | 46.13 g |

TABLE 3

Composition of parting layer formulation P2.

| Component | Source | Amount |
| --- | --- | --- |
| Polyvinylpyrrolidone, PVP-K120 | ISP Technologies | 5.00 g |
| Surfactol 365 | CasChem | 0.025 g |
| Water | | 44.975 g |

This formulation P2 differs from P1 in the choice of PVP K120, which has a weight average molecular weight of 2,900,000. The PVP used in the Formulation P1 was PVP K90, which has a weight average molecular weight of 1,270,000. Higher molecular weight is desirable for coating and film formation while lower molecular weight is desirable for increased layer solubility.

EXAMPLES 4–7

A sample of ½ oz. electroplated high temperature elongation copper foil was obtained from Oak-Mitsui for use as a carrier film. Release agent formulation P2 was coated on the carrier film using a No. 18 wire-wound rod and dried at 160° C. for 2 minutes. The coating was clear and measured to be 250 mg/ft². Different metal layer combinations are sputter deposited onto the P2 coating using argon as the processing gas:

|   | Metal Layer(s) | Comments |
|---|---|---|
| Example 4 | Gold, 3000 Angstroms | |
| Example 5 | Chrome, 100–200 Angstroms | |
| Example 6 | Copper, 3000 Angstroms, followed by, Chrome, 100 Angstroms | The thin chrome layer is used as a passivation layer between the copper and the laminate. |
| Example 7 | Copper, 1500 Angstroms, followed by, Zinc, 50–100 Angstroms | The thin zinc layer is used as a passivation layer between the copper and the laminate. When the construction is heated in the press, the zinc alloys with a thin layer of the copper forming brass |

The constructions are of the form illustrated in FIG. 1 and FIG. 2.

An adhesion layer consisting of a silane was coated on the metal layer in example 6 and 7. A solution of Gamma—glycidoxypropyl trimethoxy silane was made to 0.5% in a mixture of methanol and water, where the methanol was 90% and the water was 10%. The solution was coated on the metal surface and dried at 90° C. for 1 minute.

Each sample was pressed to make a circuit board laminate. Four layers of an FR-4 pre-preg known as FR406 (AlliedSignal) was placed on a glass reinforced Teflon® sheet. Under the sheet was a stainless steel press plate. The above construction was placed metal side down on the FR406 pre-preg. A second layer of glass reinforced Teflon® sheet was placed on the top and covered with a second stainless steel press plate. The stack was placed in a pre-heated press at 350° F. and pressed for 1.2 hours at 50 psi. After cooling to room temperature, the copper carrier film peeled easily revealing the parting layer transferred completely with the metal coating. Washing the surface in warm water removed the parting layer and revealed the shiny metal surface of the conductive layer.

The peel force required to remove the carrier layer was measured at an angle of 180° on Example 6 and Example 7. The peel force was determined to be very low and was highly repeatable. Example 6 was measured at 0.025 lbs./in. while Example 7 was measured at 0.015 lbs./in.

EXAMPLE 8

Upilex® 50 μm polyimide film was obtained from the Ube Industries. Formulation P2 was coated on the carrier film using a No. 18 wire-wound rod and dried at 160° C. for 2 minutes. The coating was clear and measured to be 250 mg/ft². A gold metal layer was sputtered on the clear coating using a Desk III sputtering unit with air as the processing gas. Gold was deposited for 3 minutes. Examining an edge of the gold coating using a visible microscope revealed 0.3 μm (3000 Angstroms) of gold was deposited.

The sample was pressed to make a circuit board laminate. Four layers of an FR-4 pre-preg known as FR406 (AlliedSignal) was placed on a glass reinforced Teflon® sheet. Under the sheet was a stainless steel press plate. The above construction was placed metal side down on the FR406 pre-preg. A second layer of glass reinforced Teflon® was placed on the top and covered with a second stainless steel press plate. The stack was placed in a pre-heated press at 350° F. and pressed for 1.2 hours at 50 psi. After cooling to room temperature, the polyimide film peeled easily revealing the parting layer transferred completely with the metal coating. Washing the surface in warm water removed the parting layer and revealed a shiny metal surface.

EXAMPLE 9

Upilex® 50 μm polyimide film was obtained from the Ube Industries for use as the carrier film. Release formulation P2 is coated on the carrier film using a No. 18 wirewound rod and dried at 160° C. for 2 minutes. The coating was clear and measured to be 250 mg/ft². A copper metal layer was vapor deposited on the clear coating using a CVE vacuum Chamber manufactured by CVC Products, Inc. Copper was deposited for approximately 4 minutes.

An adhesion layer consisting of a silane was coated on the metal layer. A solution of Gamma—glycidoxypropyl trimethoxy silane was made to 0.5% in a mixture of methanol and water, where the methanol was 90% and the water was 10%. The solution was coated on the metal surface and dried at 90° C. for 1 minute.

The sample was pressed to make a circuit board laminate. Six layers of an FR-4 pre-preg known as FR408 (AlliedSignal) was placed on a glass reinforced Teflon® sheet. Under the sheet was a stainless steel press plate. The above construction was placed metal side down on the FR408 pre-preg. A second layer of glass reinforced Teflon® sheet was placed on the top and covered with a second stainless steel press plate. The stack was placed in a pre-heated press at 350° F. and pressed for 1.2 hours at 50 psi. After cooling to room temperature the polyimide film peeled easily revealing the parting layer transferred completely with the metal coating. Washing the surface in warm water removed the parting layer and revealed a shiny metal surface.

The peel force required to remove the carrier layer was measured at an angle of 180° and found to be very low at 0.010 lbs./in. and to be highly repeatable.

EXAMPLE 10

A sample of the ½ oz. electroplated high temperature elongation copper foil was obtained from Oak-Mitsui for use as a carrier film. Release formulation P2 was coated using a No. 18 wire-wound rod and dried at 160° C. for 2 minutes. The coating was clear and measured to be 250 mg/ft². A copper metal layer was vapor deposited on the clear coating using a CVE vacuum Chamber manufactured by CVC Products, Inc. Copper was deposited for approximately 4 minutes.

The sample was pressed to make a circuit board laminate. Four layers of an FR-4 pre-preg known as FR406 (AlliedSignal) was placed on a glass reinforced Teflon® sheet was placed on the top and covered with a second stainless steel press plate. The stack was placed in a pre-heated press at 350° F. and pressed for 1.2 hours at 50 psi. After cooling to room temperature, the copper carrier film peeled easily revealing the parting layer transferred completely with the metal coating. Washing the surface in warm water removed the parting layer and revealed a shiny metal surface.

It is claimed:

1. A metal-clad laminate product for the manufacture of printed circuit boards, comprising:
   a carrier layer;
   a release layer comprising polyvinyl pyrrolidane, wherein the release layer is directly deposited on and removeably coupled to a surface of the carrier layer; and
   a conductive metal layer having a thickness of at most 10,000 Angstroms, wherein the metal layer is directly deposited on the release layer.

2. The laminate product of claim 1, wherein the polyvinyl pyrrolidone has a weight average molecular weight of between 10,000 and 5,000,000 amu.

3. The laminate product of claim 1, wherein the carrier layer is a polymeric film.

4. The laminate product of claim 1, wherein the carrier layer is a metal foil.

5. The laminate product of claim 1, further comprising an adhesive layer on the metal layer, wherein the adhesive layer is directly deposited on the opposite side of the metal layer from that side containing release layer.

6. The laminate product of claim 1, further comprising at least one semi-cured resin laminate layer to the conductive metal layer.

7. A metal-clad laminate product for the manufacture of printed circuit boards, comprising:
   a carrier layer;
   a release layer comprising polyvinyl pyrrolidone, wherein the release layer is directly deposited on and removeably coupled to a surface of the carrier layer;
   a first conductive metal layer having a thickness of at most 10,000 Angstroms, wherein the metal layer as directly deposited on a surface of the release layer; and
   a second metal layer directly deposited on the first metal layer, wherein the second metal layer has a thickness of at most 300 Angstroms.

8. The laminate product of claim 7, wherein the polyvinyl pyrrolidone has a weight average molecular weight of between 10,000 and 5,000,000 amu.

9. The laminate product of claim 7, wherein the carrier layer is a polymeric film.

10. A metal-clad laminate product for the manufacture of printed circuit boards, comprising:
    a metal foil carrier layer;
    a release layer consisting of an aqueous soluble polymer, wherein the release layer is directly deposited on and removeably coupled to a surface of the carrier layer;
    a first conductive metal layer having a thickness of at most 10,000 Angstroms, wherein the metal layer is directly deposited on a surface of the release layer; and
    a second metal layer directly deposited on the first metal layer, wherein the second metal layer has a thickness of at most 300 Angstroms.

11. A metal-clad laminate product for the manufacture of printed circuit boards, comprising:
    a carrier layer;
    a release layer consisting of an aqueous soluble polymer, wherein the release layer is directly deposited on and removeably coupled to a surface of the carrier layer;
    a first conductive metal layer having a thickness of at most 10,000 Angstroms, wherein the metal layer is directly deposited on a surface of the release layer;
    a second metal layer directly deposited on the first metal layer, wherein the second metal layer has a thickness of at most 300 Angstroms; and
    an adhesive layer on the metal layer, wherein the adhesive layer is directly deposited on the opposite side of the metal layer from that side containing release layer.

12. A metal-clad laminate product for the manufacture of printed circuit boards, comprising:
    a carrier layer;
    a release layer consisting of an aqueous soluble polymer, wherein the release layer is directly deposited on and removeably coupled to a surface of the carrier layer;
    a first conductive metal layer having a thickness of at most 10,000 Angstroms, wherein the metal layer is directly deposited on a surface of the release layer;
    a second metal layer directly deposited on the first metal layer, wherein the second metal layer has a thickness of at most 300 Angstroms; and
    at least one semi-cured resin laminate layer adhered to the conductive metal layer.

* * * * *